United States Patent
Neel et al.

(10) Patent No.: US 10,976,460 B2
(45) Date of Patent: Apr. 13, 2021

(54) DEVICE AND METHOD FOR DETECTING THE APPROACH AND/OR CONTACT, AND THE PRESSURE OF AN OBJECT IN RELATION TO A DETECTION SURFACE

(71) Applicant: FOGALE NANOTECH, Nîmes (FR)

(72) Inventors: Christian Neel, Nîmes (FR); Frédéric Ossart, Langlade (FR); Didier Roziere, Nîmes (FR)

(73) Assignee: FOGALE NANOTECH, Nîmes (FR)

( * ) Notice: Subject to any disclaimer, the term of this patent is extended or adjusted under 35 U.S.C. 154(b) by 0 days.

(21) Appl. No.: 16/469,571

(22) PCT Filed: Nov. 23, 2017

(86) PCT No.: PCT/EP2017/080162
§ 371 (c)(1),
(2) Date: Jun. 13, 2019

(87) PCT Pub. No.: WO2018/108475
PCT Pub. Date: Jun. 21, 2018

(65) Prior Publication Data
US 2019/0302304 A1    Oct. 3, 2019

(30) Foreign Application Priority Data

Dec. 16, 2016   (FR) ...................... 1662613

(51) Int. Cl.
*G01V 3/08* (2006.01)
*H03K 17/955* (2006.01)
(Continued)

(52) U.S. Cl.
CPC ........... *G01V 3/088* (2013.01); *H03K 17/955* (2013.01); *H03K 17/962* (2013.01);
(Continued)

(58) Field of Classification Search
None
See application file for complete search history.

(56) References Cited

U.S. PATENT DOCUMENTS

| 2011/0193573 A1* | 8/2011 | De Boer | G03F 9/7053 324/686 |
| 2012/0132006 A1* | 5/2012 | Roziere | G01D 5/24 73/724 |

(Continued)

FOREIGN PATENT DOCUMENTS

| JP | 5888686 B2 | 3/2016 |
| WO | 2013093326 A1 | 6/2013 |
| WO | 2015144474 A2 | 10/2015 |

OTHER PUBLICATIONS

French Search Report from French Patent Application No. 1662613, dated Aug. 28, 2017.

(Continued)

*Primary Examiner* — Nasima Monsur
(74) *Attorney, Agent, or Firm* — Greer, Burns & Crain, Ltd.

(57) ABSTRACT

A device for detecting an object with respect to a detection surface including at least one measurement electrode and at least one guard electrode separated by a distance (D) that is elastically modifiable locally by a load exerted by the object on the detection surface; and structure for electrical polarization of the electrodes (V, E) arranged in order to: (i) apply to the measurement and guard electrodes one and the same first alternating electrical potential ($V_g$) so as to measure a first signal relating to an electrode-object capacitance ($C_{eo}$); and (ii) apply between the measurement and guard electrodes an alternating electrical potential difference (V1), so as to measure a second electrical signal relating to an electrode-guard capacitance ($C_{eg}$).

(Continued)

A detection method utilizing the present detection device is also provided.

21 Claims, 4 Drawing Sheets

(51) Int. Cl.
*H03K 17/975* (2006.01)
*H03K 17/96* (2006.01)

(52) U.S. Cl.
CPC ... *H03K 17/975* (2013.01); *H03K 2017/9606* (2013.01); *H03K 2217/960765* (2013.01)

(56) References Cited

U.S. PATENT DOCUMENTS

| | | | |
|---|---|---|---|
| 2012/0187965 A1* | 7/2012 | Roziere | G06F 3/044 324/688 |
| 2012/0188200 A1* | 7/2012 | Roziere | G06F 3/044 345/174 |
| 2014/0267165 A1* | 9/2014 | Roziere | G06F 3/044 345/174 |
| 2018/0059871 A1* | 3/2018 | Fukushima | G06F 3/0412 |

OTHER PUBLICATIONS

International Search Report from International Patent Application No. PCT/EP2017/080162, dated Mar. 8, 2018.
Written Opinion of the International Search Authority from International Patent Application No. PCT/EP2017/080162, dated Mar. 8, 2018.

* cited by examiner

DEVICE AND METHOD FOR DETECTING THE APPROACH AND/OR CONTACT, AND THE PRESSURE OF AN OBJECT IN RELATION TO A DETECTION SURFACE

BACKGROUND

The present invention relates to a device for detecting on the one hand the approach of an object towards a surface, and/or the contact of said object with said surface, and on the other hand the pressure of said object on said surface. It also relates to a method utilizing such a device.

The field of the invention is, non-limitatively, that of interfaces for the capacitive detection of objects for an electronic device, making it possible for said device to detect neighbouring objects, in particular in the field of robotics.

Electronic devices interact with their environment in an increasingly autonomous manner. This autonomous interaction most often requires the possibility of detecting objects/persons located in proximity to or in contact with the device, in particular when said device is a robot, whether or not it is mobile. Such detection of approach and contact is carried out by means of a detection surface equipped with sensors for detecting approach and/or contact, in particular capacitive sensors.

In order to complete this interaction, it appears necessary to detect, in addition to the approach and contact, a pressure, a load or a force exerted by an object on a detection surface of the device. Sensors currently exist for detecting a pressure on a detection surface of a device.

However, the addition of such a pressure detection sensor in a detection surface already equipped with approach and contact sensors proves to be costly, bulky and complex. In addition, the juxtaposition of sensors dedicated to the detection of approach and contact and sensors dedicated to the detection of a pressure creates mutual interferences that degrade the operation and the effectiveness of these sensors.

A purpose of the present invention is to overcome the abovementioned drawbacks.

Another purpose of the present invention is to propose a single sensor device making it possible to detect on the one hand approach and/or contact, and on the other hand the pressure of an object on a detection surface.

Yet another purpose of the present invention is to propose a single sensor device making it possible to detect on the one hand the approach and/or contact, and on the other hand a pressure, that is less bulky, less costly and less complex compared to a juxtaposition of two existing sensors, one dedicated to the detection of approach and contact and the other dedicated to the detection of pressure.

SUMMARY

At least one of these purposes is achieved with a device for detecting an object with respect to a detection surface, said device comprising:
- at least one measurement electrode;
- at least one electrode, called guard electrode, in particular placed facing said measurement electrode; and
- measurement electronics for measuring a signal with respect to the electrical capacitance of said measurement electrode;

characterized in that said measurement and guard electrodes are separated by a distance that is elastically modifiable locally, by a load exerted by said object on said detection surface; and in that it comprises means for electrical polarization of electrodes arranged in order to:
- apply to the measurement and guard electrodes:
  - one and the same first alternating electrical potential, or first alternating potentials that are substantially identical;

that is(are) different from a ground potential, so as to measure a first signal with respect to the capacitance, called electrode-object capacitance, between said measurement electrode and said object; apply between the measurement and guard electrodes an alternating electrical potential difference, so as to measure a second signal with respect to the capacitance, called electrode-guard capacitance, between said electrodes.

The electrode-object capacitance is representative of an approach and/or a contact of the object with the detection surface. The electrode-guard capacitance is representative of a pressure, a load and/or a force exerted by said object on said detection surface. This pressure, load or force can be exerted axially (perpendicularly to the detection surface), or comprise a tangential shear component.

According to the embodiments of the invention, the means for electrical polarization of the electrodes comprise, non-limitatively, at least one of the following elements: at least one electrical source, at least one electrical switch, at least one control means arranged in order to control the at least one electrical source and/or the at least one electrical switch. A control means arranged in order to control an electrical source can for example control this source so that it generates a signal or a voltage, and/or in order to modify the signal generated, and/or in order to stop the source so that it acts as a short-circuit or a passive component. To this end, this control means can for example act on a clock signal or a reference voltage.

An electrical potential can be applied to electrodes, non-limitatively, by electrically connecting these electrodes to this potential, or by subjecting these electrodes, directly or via electronic components and/or tracks or connecting wires and/or any other means of electrical coupling (electric field, induction), to this electrical potential or to a source generating this electrical potential.

Similarly, in the context of the invention, electrically polarizing electrodes at an electrical potential can mean for example subjecting these electrodes to the electrical potential, or applying the electrical potential to the electrodes.

By "ground potential" is meant a reference potential for the electronics or a part of the electronics. A ground potential can also correspond to an earth or an earth potential.

The electrical potentials can be defined, without loss of generality, with respect to an electrical reference which can be the reference point of the source which generates them, or a general reference potential such as a ground potential.

By "alternating potential" is meant a potential that is variable over time with at least one frequency component at a non-zero frequency.

The first potential can thus be defined (or referenced), non-limitatively, with respect to the ground potential. In this case, the first potential can also correspond to a potential difference with respect to the ground potential considered as zero.

In order to apply the alternating electrical potential difference (or the difference in alternating electrical potential), the polarization means are arranged in order to apply, respectively, a third potential to the measurement electrode, and a fourth potential to the guard electrode. These third and fourth potentials can be defined (or referenced), non-limitatively, with respect to the ground potential. The alternating electrical potential difference therefore corresponds to the difference between these third and fourth potentials, or, in other words, to a differential potential applied between the measurement electrode and the guard electrode.

Generally, the electrical potentials applied to the measurement and guard electrodes in order to generate the first alternating potential and the alternating potential difference can have any shape, and in particular sinusoidal, square, triangular, etc. They can be generated directly, or by using pulse width modulation (PWM) techniques.

In the context of the present invention, the first alternating potentials applied to electrodes can be considered to be substantially identical when they do not generate any usable electrode-guard capacitance measurement at the output of the measurement electronics. The following can in particular be mentioned as examples of identical or substantially identical first alternating electrical potentials:

alternating potentials having one and the same temporal shape (sinusoidal, square, triangular, etc.), one and the same variation amplitude and one and the same phase (or in other words varying synchronously);

alternating potentials which comprise at least one spectral component with identical amplitude and phase at at least one working frequency.

It should be noted that the electrodes can be polarized, or subjected to a global potential, corresponding to superposition of a first alternating electrical potential that is identical or substantially identical for each electrode and other potentials with other components that are optionally different for each electrode but which do not generate a usable electrode-guard capacitance measurement at the output of the measurement electronics.

Thus, according to the modes of implementation of the measurement electronics, the electrode-object capacitance can be measured by applying respectively to the measurement and guard electrodes, global potentials comprising identical first alternating electrical potentials, and different components such as a direct component, or a frequency component which is not within the passband for detection of the measurement electronics, or even another component with a waveform orthogonal to that of the first alternating electrical potentials.

Thus, the device according to the invention makes it possible to measure, with a single measurement electronics and a set of (at least) two electrodes, on the one hand a first signal depending on (or representative of) a first item of information which is the approach and/or the contact of an object with the detection surface, and on the other hand, a second signal depending on (or representative of) a second item of information which is the pressure, or the load, exerted by the object on the detection surface. It is thus possible to obtain measurements of approach and contact on the one hand, and load on the other hand, separately and unambiguously.

Consequently, the device according to the invention is less costly, less bulky and less complex to utilize compared to a juxtaposition of two dedicated sensors, one for the detection of approach and contact, and the other for the detection of pressure. In addition, the device according to the invention has a better detection performance compared to a configuration using two independent sensors that could interfere with one another.

Advantageously, the first signal with respect to the electrode-object capacitance and the second signal with respect to the electrode-guard capacitance can be measured by the measurement electronics at one and the same measurement point.

Thus, the implementation of the device according to the invention is simplified.

According to the embodiments, the first signal depending on the electrode-object capacitance and the second signal depending on the electrode-guard capacitance can be measured simultaneously, by applying to the electrodes, simultaneously or sequentially, the first alternating electrical potential and the alternating potential difference.

According to embodiments, the means for electrical polarization of the electrodes can be arranged so as to generate a first alternating electrical potential and an electrical potential difference satisfying at least one of the following criteria:

the first alternating electrical potential and the electrical potential difference comprise respectively at least one frequency component at a different frequency;

the first alternating electrical potential and the electrical potential difference comprise signals that are orthogonal to one another.

Thus it is possible to generate a first electrical signal depending on the electrode-object capacitance and a second electrical signal depending on the electrode-guard capacitance that are coded differently, and therefore that can be distinguished even if they are generated simultaneously and measured on the same measurement electrode.

When a first alternating electrical potential and an electrical potential difference are implemented with at least one frequency component at a different frequency, it is possible to produce frequency multiplexing and demodulate separately the first electrical signal and the second electrical signal that arise therefrom at different working frequencies.

Orthogonal signals are defined as being signals of which the scalar product of any two of these signals over a number of samples or a predetermined duration is zero or almost zero (with respect to the modulus of these signals, i.e. the scalar product of these signals with themselves). Moreover, the conventional definition is used of a scalar product in a vector space equipped with an orthonormal base, being the sum of the products term-by-term of the samples of the signals within the predetermined duration.

Implementing a first alternating electrical potential and an electrical potential difference with signals that are orthogonal to one another, combined with synchronous detection as explained hereinafter, makes it possible to demodulate the first electrical signal and the second electrical signal which arise independently therefrom, while minimizing the crosstalk effects between them.

It should be noted that signals at different frequencies are not generally orthogonal to one another. They can however be orthogonal to one another if they have frequencies that correspond to integer multiples of one another.

Furthermore, orthogonal signals can be signals having the same frequency or more generally the same shape, the same amplitude but in phase quadrature.

According to embodiments, the device according to the invention can comprise measurement electronics with at least one demodulation means utilizing at least one of the following elements:

a synchronous demodulator;
an amplitude detector;
a digital demodulator.

Generally, a synchronous demodulator can be represented by (or comprise) a multiplier which carries out a multiplication of the measurement signal with the carrier signal and a low-pass filter.

The carrier signal can be, or comprise, respectively:
the first alternating electrical potential, for the demodulation of the first electrical signal;
the alternating electrical potential difference, for the demodulation of the first electrical signal.

The utilization of synchronous demodulators makes it possible to demodulate frequency-division multiplexed signals at different working frequencies, and/or to demodulate signals that are orthogonal to one another.

An amplitude detector (or asynchronous demodulator) can be represented by (or comprise) a rectifying element such as a diode rectifier, selector switches or a quadratic detector, and a low-pass filter. It makes it possible to obtain the amplitude of the modulated measurement signal originating from the current detector.

The utilization of amplitude detectors makes it possible to demodulate frequency-division multiplexed signals at different working frequencies.

The demodulation means can also comprise pass band or anti-aliasing low-pass filters placed before the demodulation.

Of course, the demodulation means can be produced in a digital and/or analogue form. They can in particular comprise an analogue-to-digital converter and a microprocessor and/or an FPGA which digitally carries out synchronous demodulation, amplitude detection or any other demodulation operation.

According to embodiments, the device according to the invention can comprise a first demodulation means exploiting the first alternating electrical potential in order to determine the first signal, and a second demodulation means exploiting the alternating electrical potential difference in order to determine the second signal.

In this case, the first demodulation means can use as carrier signal the first alternating electrical potential for the demodulation of the first electrical signal, and the second demodulation means can use as carrier signal the alternating electrical potential difference for the demodulation of the second electrical signal.

Provided that the first alternating electrical potential and the alternating electrical potential difference are carefully chosen as explained above, the first electrical signal and the second electrical signal can be demodulated simultaneously, in parallel.

According to embodiments, the means for electrical polarization of the electrodes can be arranged in order to generate an alternating electrical potential difference with an amplitude different from the amplitude of the first alternating electrical potential.

In particular, the means for electrical polarization of the electrodes can be arranged in order to generate an alternating electrical potential difference with an amplitude less than the amplitude of the first alternating electrical potential. The alternating electrical potential difference can for example have an amplitude less than $\frac{1}{2}$, or $\frac{1}{5}$, or $\frac{1}{10}$, or $\frac{1}{100}$ of the amplitude of the first alternating electrical potential. Such an amplitude difference makes it possible to compensate for the difference in values between the electrode-guard capacitance and the electrode-object capacitance (the electrode-guard capacitance can have a higher value, for example of the order of 2 to 100 times higher, than the electrode-object capacitance) and detect the two capacitances under good conditions with the measurement electronics. It should be noted that a similar result can be obtained with an alternating electrical potential difference with an amplitude greater than the amplitude of the first alternating electrical potential, inasmuch as it is the difference in obtained potentials that produces the compensation effect.

According to embodiments, the means for electrical polarization of the electrodes can comprise a first electrical source referenced at the input to the ground potential and supplying the first alternating electrical potential.

In other words, the first electrical source generates between its terminals a potential difference equal to the first alternating electrical potential.

According to embodiments, the first electrical source can be electrically connected at the output to the at least one guard electrode, and the means for electrical polarization of the electrodes can also comprise a first source switch making it possible to electrically polarize the at least one measurement electrode either at the first alternating electrical potential or at the ground potential.

Thus, in a first position of the first source switch, the first alternating electrical potential is applied to the measurement electrodes and to the guard electrodes, which makes it possible to measure the first electrical signal.

In a second position of the first source switch, an alternating electrical potential difference, which corresponds in this case to the first alternating electrical potential, and which makes it possible to measure the second electrical signal, is applied between the measurement and guard electrodes.

According to embodiments, the means for electrical polarization of the electrodes can comprise a second electrical source supplying between its terminals the alternating electrical potential difference, said second voltage source being referenced at the input to the first alternating electrical potential, and being arranged at the output according to one of the following configurations:
so as to apply the alternating electrical potential difference to the at least one guard electrode;
so as to apply the alternating electrical potential difference to the at least one measurement electrode.

According to embodiments, the means for electrical polarization of the electrodes can comprise at least one of the following switches:
a first switch arranged so as to make it possible to apply to the at least one guard electrode and to the at least one measurement electrode, either the ground potential or the first alternating electrical potential (originating for example from the first electrical source);
a second switch arranged so as to make it possible to apply between the at least one guard electrode and the at least one measurement electrode, either the alternating electrical potential difference (such as that generated for example by the second electrical source), or a zero or substantially zero potential difference.

The first and the second switch can comprise all types of controllable electrical switches, for example based on electromechanical relays or transistors.

The first switch can comprise an output that can be selectively connected to an input connected to the ground potential, or to an input connected to the output of the first electrical source.

The second switch can comprise an output that can be selectively connected to an input connected to the output of the first electrical source or to the output of the first switch if appropriate, or to an input connected to the output of the second electrical source.

The device according to the invention can also comprise at least one calculation module configured in order to:
- determine a distance or a contact between the object and the detection surface as a function of the first signal (and/or a speed, a path, a movement, a gesture, etc.); and/or
- determine a load applied by said object on the detection surface as a function of the second signal.

The at least one calculation module can determine said distance or contact, respectively said load, by calculation or by comparison with a previously established reference table.

The at least one calculation module can determine said distance or contact directly as a function of the first measured signal or a digitized version of said signal; or of an electrode-object capacitance value deduced from said first signal, measured or digitized.

The at least one calculation module can determine said load directly as a function of the second measured signal or of a digitized version of said signal; or of an electrode-guard capacitance value deduced from said second signal, measured or digitized.

According to embodiments, the device according to the invention can comprise at least one measurement electrode and at least one guard electrode separated by a layer that is elastically compressible, in particular locally, comprising, or formed by, a dielectric material.

The dielectric material can for example comprise:
- a dielectric fluid, such as oil;
- a dielectric polymer, such as a silicon-based polymer; or
- a dielectric foam, such as a foam made from polyester or silicone.

Of course, the dielectric material can comprise or be composed of several materials, such as for example structured materials (polymer/air) for reducing stiffness.

According to embodiments, the device according to the invention can comprise one or more measurement and/or guard electrodes produced for example:
- from a deposit of conductive ink, deposited for example with a screen printing or ink jet process, on a surface of dielectric material;
- from layers of metallic materials such as copper, silver or other conductive materials such as carbon or metal oxides (indium tin oxide or ITO, zinc oxide or ZnO) deposited by a vacuum deposition process or etched by an etching process;
- from a printed circuit board or similar, rigid, semi-rigid or flexible (dielectric epoxy, polyimide, PET etc.) with one single or several layers of metal etc.;
- with conductive polymers;
- in the form of fabric or layers of fabric, with wires made from conductive material (metal, etc.) woven or knitted etc.;
- from liquid substances (such as water) incorporated into a leaktight insulating material.

According to embodiments, the device according to the invention can comprise one or more transparent measurement and/or guard electrodes. Such electrodes can be produced for example with a deposit of transparent conductive oxide, such as for example indium tin oxide (or ITO), on a layer of transparent dielectric polymer such as polyethylene terephthalate (PET).

The connecting tracks of at least one of the measurement and guard electrodes can also be transparent.

The elastically compressible separation layer can also be produced from a transparent dielectric material. To this end, it can be produced, for example, from flexible transparent plastic or from polydimethylsiloxane (or PDMS).

According to embodiments, the device according to the invention can comprise at least one measurement electrode placed on, or in, or under, a support, produced from a flexible material, such as a fabric (for example a woven or knitted structure), placed above and at a distance from at least one guard electrode, and being at least locally deformed when a load is exerted on said support.

In this case, the measurement electrode or electrodes can be produced for example in a fabric, or in the form of fabric or layers of fabric, with wires made from a conductive material (metal, etc.) woven or knitted etc.

According to embodiments, the device according to the invention can comprise several measurement electrodes.

The device according to the invention can comprise in particular a plurality of measurement electrodes distributed in the plane of the detection surface.

The measurement electrodes can in particular be placed in an array arrangement.

According to embodiments, the device according to the invention can comprise one or more guard electrodes arranged according to at least one of the following configurations:
- at least one guard electrode, placed opposite several, in particular all, the measurement electrodes;
- for at least one, in particular each, measurement electrode, a guard electrode placed opposite said measurement electrode;
- for at least one, in particular each, measurement electrode, several guard electrodes placed opposite said measurement electrode.

According to embodiments, the device according to the invention can also comprise at least one second guard electrode polarized at an identical potential to the potential of the measurement electrode or electrodes.

The device can comprise in particular one or more second guard electrodes placed, for example:
- in one and the same plane as measurement electrodes (for example in order to protect connecting tracks);
- in one and the same plane (and around) the guard electrodes;
- opposite the guard electrodes, with respect to their face opposite to the measurement electrodes.

According to embodiments, the device according to the invention can comprise:
- an array of measurement electrodes;
- individual guard electrodes placed opposite the measurement electrodes, and electrically connected to one another;
- a second guard electrode placed around the guard electrodes, in one and the same plane.

According to embodiments, the device according to the invention can comprise several measurement electrodes, and an electrode switch making it possible to selectively connect a measurement electrode, called "active electrode", to the measurement electronics, said electrode switch also being arranged in order to polarize the other measurement electrodes at the same electrical potential as the active electrode.

The electrode switch can make it possible in particular to sequentially select a plurality, or all, of the measurement electrodes as active electrode.

Thus it makes it possible to use measurement electronics (or a measurement channel) in order to carry out a sequential measurement with several measurement electrodes.

Thus, a device according to the invention with a plurality of measurement electrodes can comprise:
- Measurement electronics with a single measurement channel and an electrode switch, making it possible to sequentially poll all the measurement electrodes (sequential measurements);
- One or more measurement electronics utilizing several measurement channels, each with an electrode switch making it possible to poll a portion of the measurement electrodes (sequential and parallel measurements);
- As many measurement electronics or measurement channels as measurement electrodes, without electrode switch, in order to simultaneously poll all of the measurement electrodes (parallel measurements).

According to embodiments, the device according to the invention, in a configuration with a second electrical source arranged so as to apply the alternating electrical potential difference to a plurality of guard electrodes, can also comprise a guard electrodes switch making it possible to selectively connect one or a plurality of guard electrodes, called "excited guard electrode or electrodes", to the second source, said electrode switch also being arranged in order to polarize the other guard electrodes at the same electrical potential as the active electrode.

This embodiment has the advantage of making it possible to improve the spatial resolution during the measurement of the second signal (the load) with respect to the spatial resolution obtained with the measurement electrodes, in particular when the device according to the invention comprises several guard electrodes placed opposite a measurement electrode. In fact, in this case, if the measurement electrode is deformable, the spatial resolution of the measurement is determined by the dimension of the excited guard electrode or electrodes.

According to embodiments, the measurement electronics can comprise a circuit utilizing an operational amplifier with an impedance comprising a feedback capacitive component, the measurement electrode or electrodes being connected to the negative input of said operational amplifier.

The measurement electronics can thus for example implement a charge amplifier with a feedback capacitance.

The circuit implementing an operational amplifier can be produced in any form, in particular analogue or digital, making it possible to perform an operational amplifier function.

It is recalled that an operational amplifier is a component model that is well known to a person skilled in the art, with a positive input and a negative input having ideal infinite impedance, and which generates at the output a signal corresponding to the difference of the potentials applied to the inputs, amplified with an ideal infinite gain.

The device according to the invention can also comprise measurement electronics with a circuit implementing a circuit for the conversion of charges to an electrical or digital signal (switched capacitance, etc.).

According to embodiments, the circuit implementing an operational amplifier can be supplied by an electrical supply referenced to the first alternating electrical potential.

According to other embodiments, the circuit implementing an operational amplifier can be supplied by an electrical supply referenced to ground.

According to another aspect of the same invention, a method is proposed for detecting an object with respect to a detection surface, utilizing a detection device according to the invention.

In particular, according to a general definition, the method according to the invention comprises at least one iteration of the following steps:
- a first step of detecting the approach and/or contact of the object with respect to said detection surface comprising the following operations:
  - applying to the measurement and guard electrodes:
    - one and the same first alternating electrical potential, or
    - of the first, substantially identical, alternating potentials; that is(are) different from a ground potential;
  - measuring a first signal with respect to the capacitance, called electrode-object capacitance, between said measurement electrode and said object; and
- a second step of detecting pressure of the object on said detection surface comprising the following operations:
  - applying, between the measurement and guard electrodes, an alternating electrical potential difference, and
  - measuring a second signal with respect to the capacitance, called electrode-guard capacitance, between said measurement and guard electrodes.

Detecting approach and/or contact can comprise for example measuring distance, detecting approach, measuring or detecting contact.

The detection of pressure can comprise for example detecting pressure, measuring force, measuring load.

The method according to the invention can also comprise, in terms of steps or operation, the functions implemented by the device according to the invention, according to the characteristics described above, in each of the embodiment modes/examples.

According to the modes of implementation, and as described above, the first step and the second step can be carried out simultaneously or sequentially.

According to modes of implementation, when the detection device comprises a plurality of measurement electrodes, the second detection step can be carried out (sequentially or in parallel) only in an area of the detection surface in which the object was detected (for example in proximity to, or in contact with, the detection surface) during the first detection step.

Thus, is it not necessary to scan the entire detection surface during the second detection step, or to apply this second detection step to the entire detection surface.

According to modes of implementation, the method according to the invention can comprise a calibration step comprising:
- detecting approach and/or contact;
- in the absence of a detected object, detecting pressure so as to determine an electrode-guard capacitance called "calibration capacitance".

The condition of absence of a detected object can be realized as a function of a criterion that can be for example:
- the measured electrode-object capacitance is zero or at the level of the measurement noise, which corresponds to a total absence of detection;
- the measured electrode-object capacitance is less than a predetermined threshold for which it is certain that there is no object in contact with the detection surface (which is sufficient for there to be no pressure exerted), even if there is an object within the vicinity of this detection surface.

The electrode-guard calibration capacitance, which corresponds to a condition of absence of load or pressure, and therefore to a nominal distance between the measurement and guard electrodes, can then be used to calibrate the pressure or load measurements. It makes it possible to compensate in particular for the variations in distances that can develop over time when pressure is absent, due to crushing or variations in the properties of the materials between the electrodes.

According to modes of implementation, when the detection device comprises a plurality of measurement electrodes, the calibration step can be carried out locally, in at least one area of the detection surface (or by areas of the detection surface).

According to modes of implementation, the method according to the invention can comprise a functional verification step comprising a comparison of an electrode-guard calibration capacitance with a nominal electrode-guard capacitance or a range of nominal electrode-guard capacitances.

The nominal electrode-guard capacitance or the range of nominal electrode-guard capacitances correspond to expected capacitance values, determined beforehand, corresponding to correct functioning of the device.

This verification step makes it possible to verify at any moment the correct functioning of the device, which is essential for safety-related applications. In fact, if the measured electrode-guard calibration capacitance is not within a range of expected values, this means that the device is faulty and therefore that there is a risk that it will not detect objects in proximity or in contact. It is thus possible in particular to trigger an alarm very reliably.

The object detected can be for example a hand, wearing or not wearing a glove, any other part of the human body, a stylus, for example made from plastic or metal.

The detected object can also be any object in the environment of the detection device, such as a tool, a wall etc.

According to yet another aspect of the invention, a detection layer is proposed for an item of equipment comprising a detection device according to the invention.

The device according to the invention, in particular the electrodes, is(are) able to be integrated in the detection layer.

The item of equipment can in particular comprise a device or an electronic device, such as for example a part of a robot or a robot.

The detection layer can be placed on, or integrated in, a surface or a casing of the appliance.

Alternatively, the detection layer can have the form of a trim element, such as a textile trim, independent of said device.

The detection layer can also have the form of a skin (or "sensitive skin") making it possible to cover all or part of a robot for example of humanoid form. This skin can be designed so as to have an appearance (colour, surface, touch etc.) close to that of human skin.

The detection layer can also have the form of a trim part or element that is tubular in shape, suitable for being placed for example around a limb or a portion of a limb of a robot.

The equipment can also comprise an item of medical equipment or an item of equipment for medical use, such as a bed, a mattress, a seat or a seat cushion.

In this case, the detection layer can in particular be produced in the form of a trim element such a sheet or a cover, or form an integral part of the item of equipment.

In this case, the device according to the invention can be used, non-limitatively, in order to detect the presence of a body or a person, the position thereof, the load exerted (for example in order to prevent bedsores); the movements, physiological parameters (respiration, heartbeat) thereof, the presence of moisture (urine), etc.

According to yet another aspect of the invention, an item of equipment is proposed equipped with a detection device according to the invention.

The item of equipment can comprise in particular a device or an electronic device, such as for example a part of a robot or a robot.

The item of equipment can also comprise an item of medical equipment or an item of equipment for medical use, such as a bed, a mattress, a seat or a seat cushion.

The detection device can be arranged in particular so that the measurement and guard electrodes are placed on at least a portion of the periphery of the item of equipment.

According to embodiments of said item of equipment:
the measurement and guard electrode or electrodes can be placed on, or in, or under, a surface or a casing of said equipment;
the measurement and guard electrode or electrodes can be placed in a trim element independent of said item of equipment, and mounted on said item of equipment;
the guard electrode or electrodes can be placed on, or in, or under, a surface or a casing of said item of equipment; and the measurement electrode or electrodes can be placed in a trim element independent of said item of equipment, and mounted on said item of equipment.

BRIEF DESCRIPTION OF THE DRAWINGS

Other advantages and characteristics will become apparent on examination of the detailed description of non-limitative examples and from the attached drawings in which.

DETAILED DESCRIPTION

It is well understood that the embodiments that will be described hereinafter are in no way limitative. In particular, variants of the invention may be envisaged comprising only a selection of characteristics described hereinafter, in isolation from the other characteristics described, if this selection of characteristics is sufficient to confer a technical advantage or to differentiate the invention with respect to the state of the prior art. This selection comprises at least one, preferably functional, characteristic without structural details, or with only a part of the structural details if this part alone is sufficient to confer a technical advantage or to differentiate the invention with respect to the state of the prior art.

In particular, all the variants and all the embodiments described may be combined together if there is no objection to such combination from a technical point of view.

In the figures, elements that are common to several figures retain the same reference.

Figure 1:
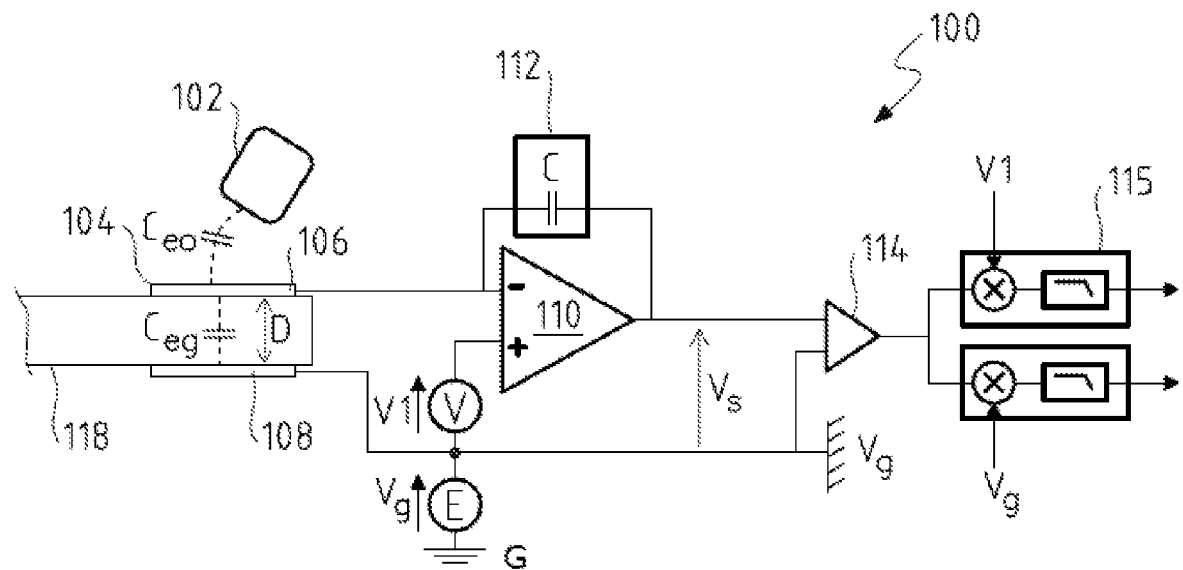
FIG. 1 is a diagrammatic representation of the electrical principle of a first non-limitative embodiment example of a device according to the invention.

FIG. 1 is a diagrammatic representation of the electrical principle of a first non-limitative embodiment example of a detection device according to the invention.

The device 100, represented diagrammatically in FIG. 1, is intended to detect the approach, the contact and the pressure exerted by a control object 102 on a detection surface 104.

To this end, the device 100 comprises at least an electrode 106, called measurement electrode, placed level with, or opposite, the detection surface 104, and an electrode 108, called guard electrode, placed opposite the measurement electrode 106 according to the face thereof opposite to the detection surface 104, and at a distance from this measurement electrode 106.

In the embodiments shown, the detection surface 104 is represented by a face of the measurement electrode or electrodes 106, preferably covered with a thin layer of electrically insulating material (polyimide, insulating varnish, etc.) in order to avoid short-circuits with the control object 102.

The device 100 also comprises an electronic circuit which can be represented in the form of an operational amplifier (OA) 110, whose output is looped on its negative input by an impedance 112, which can be for example a capacitor, a capacitor combined with a resistor, or a capacitor combined with a reset or discharge switch. In the example shown, the impedance 112 is formed by a capacitor C.

The device 100 also comprises a first electrical source E, which supplies a first alternating potential $V_g$. The first electrical source E is also called guard electrical source, and the first alternating potential $V_g$ is also called guard potential $V_g$, for reasons that will be explained hereinafter. This first alternating potential $V_g$, or guard potential $V_g$, is different from a ground electrical potential, referenced G, corresponding to the general ground potential of the system (which can be for example earth). The first electrical source E is connected at the input to the ground potential G and at the output in particular to the guard electrode 108.

It should be noted that the control object 102, by definition, is normally polarized at the ground potential G, directly or indirectly by resistive or capacitive coupling. Of course, it is not necessary for the object to be perfectly polarized at this ground potential G. In order for it to be detected, it is simply necessary for it to be polarized at a potential different from the guard potential $V_g$.

In the embodiments shown, the operational amplifier (OA) 110 is referenced to the guard potential $V_g$. To this end, it is supplied by an electrical supply source (not shown) that is also referenced to the guard potential $V_g$.

Alternatively, the operational amplifier (OA) 110 can be referenced to the ground potential, while being supplied by an electrical supply source (not shown) referenced to the electrical ground potential G.

The voltage $V_s$ present on the output of the OA 110 is referenced to the guard potential $V_g$.

In order to obtain a voltage $V_s$ referenced to the general ground potential G, the device comprises a module 114 shown in the form of a differential amplifier 114, electrically referenced to the general ground potential G, and connected at the input respectively to the output of the OA 110 and to the guard potential. Thus an image signal of $V_s$ is obtained at the output of this differential amplifier 114, referenced to the general ground potential G.

In the example shown, the device 100 also comprises a second electrical source V, placed between the positive input of the OA 110 and the guard source E, and supplying an alternating electrical potential difference V1.

In this embodiment, the measurement electrode 106 is connected to the negative input of the OA 110, and the guard electrode 108 is connected at a point between the guard source E and the second source V.

Due to the very high impedance and open-loop gain of the OA 110, it can be considered that the measurement electrode 106 connected to the negative input of the OA 110 is polarized (with respect to the ground potential G) at an electrical potential corresponding to the sum of the guard potential $V_g$ (or of the first alternating electrical potential $V_g$) and the alternating electrical potential difference V1.

The guard electrode is polarized at the guard potential or first alternating electrical potential $V_g$.

The measurement electrode 106 is arranged such that the distance D between the measurement electrode 106 and the guard electrode 108 can be elastically modified, locally, by a load exerted by the control object 102 on the detection surface 104. In particular, when a load is applied on the detection surface 104, the measurement electrode 106 moves closer to the guard electrode 108. To this end, the measurement 106 and guard 108 electrodes are placed on either side of (or in) a layer 118 formed by an elastically compressible dielectric material, such as for example foam or plastic or also a liquid dielectric.

Under these conditions, the approach and the contact of the control object 102 with the detection surface 104 can be detected and/or measured by measuring a value representative of a capacitance $C_{eo}$, called electrode-object capacitance, formed between the measurement electrode 106 and the control object 102. Once in contact with the detection surface 104, the load exerted by the control object 102 can be detected and/or measured by measuring a value of a capacitance $C_{eg}$, called electrode-guard capacitance, formed between the measurement electrode 106 and the guard electrode 108.

In both cases, it is possible to link the measured capacitances by using the parallel-plate capacitor law, respectively to a distance between the measurement electrode and the object and a distance between the measurement electrode and the guard electrode. The load can thus be calculated from the variation in the measured thickness of the dielectric material 118.

The signal $V_s$ measured at the output of the OA 110 comprises a combination of a first signal $V_{sa}$, and a second signal $V_{sp}$ which depend respectively on the electrode-object capacitance $C_{eo}$, and a sum of the electrode-object and electrode-guard $C_{eg}$ capacitances:

$$V_s = V_{sa} + V_{sp} \tag{1}$$

with $$V_{sa} = V_g \frac{C_{eo}}{C} \tag{2}$$

and $$V_{sp} = V1 \cdot \left(1 + \frac{C_{eo} + C_{eg}}{C}\right) \tag{3}$$

According to a mode of implementation, a first electrical potential $V_g$ and a potential difference V1 are generated with different fundamental frequencies sufficiently spaced apart in order to be capable of being separated by demodulation and/or by filtering. These signals can be for example sinusoidal or square. In this case, the first and second signals $V_{sa}$ and $V_{sp}$ obtained also have different fundamental frequencies. It is then possible to obtain the respective amplitude of these first and second signals $V_{sa}$ and $V_{sp}$ by demodulating the signal $V_s$ around, respectively, the fundamental frequency of the first electrical potential $V_g$ for the first signal $V_{sa}$, and the fundamental frequency of the potential difference V1 for the second signal $V_{sp}$. It is then possible to deduce from the amplitude of these signals, respectively, the electrode-object capacitance $C_{eo}$ and the sum of the electrode-object and electrode-guard capacitances $C_{eo}+C_{eg}$, thus the electrode-guard capacitance $C_{eg}$. Thus there is obtained simultaneously, a first signal with respect to the value of the electrode-object capacitance $C_{eo}$, and a second signal with respect to the value of the electrode-guard capacitance $C_{eg}$.

To this end, the device 100 comprises two synchronous demodulators 115 which carry out the functions of multiplication of the signal $V_s$ originating from the OA 110 with respectively, a carrier signal corresponding to the first electrical potential $V_g$, and a carrier signal corresponding to the potential difference V1, then low-pass filtering.

These demodulations of first and second signals $V_{sa}$ and $V_{sp}$ at different frequencies can also be carried out with an asynchronous demodulator comprising rectification followed by a low-pass filter.

Preferably, the signal $V_s$ is pass-band filtered around, respectively, fundamental frequencies of the first and second signals $V_{sa}$ and $V_{sp}$ before demodulation.

According to other modes of implementation, a first electrical potential $V_g$ and a potential difference V1 can be generated in the form of signals that are orthogonal to one another (i.e. the scalar product of which is zero). Such signals can be generated for example in the form of phase quadrature signals (for example sinusoidal or square), or in the form of binary sequences constituting orthogonal base signals.

In this case, it is possible to demodulate the first and second signals $V_{sa}$ and $V_{sp}$, as previously with synchronous demodulators 115, by using respectively, a carrier signal corresponding to the first electrical potential $V_g$, and a carrier signal corresponding to the potential difference V1, then low-pass filtering. More generally, if the first signal $V_{sa}$ is demodulated with a carrier signal orthogonal to the second signal $V_{sp}$ and vice-versa, it is possible to obtain their respective amplitudes without crosstalk.

Of course, these demodulation operations can be carried out in an analogue manner, with analogue electronics components, and/or digitally, with a FPGA, a microprocessor, etc. They can for example be carried out by digitizing the analogue signals (for example the signal $V_s$) then carrying out the demodulation operations by calculation with an FPGA or a microprocessor.

It is also possible to implement the device 100 with the guard source E and the second source V turned on alternately (and thus one at a time). In this case, measurements are taken alternately at the output of the OA of a signal $V_s$ that corresponds respectively to the first signal $V_{sa}$ or to the second signal $V_{sp}$, depending on the source that is turned on. It is then possible to demodulate this signal $V_s$ as previously with two demodulators 115, or to use only a single demodulator, switching the carrier signal so that it corresponds to that of the turned on source.

It should be noted that a voltage source, such as the first electrical source E or the second electrical source V, behaves as a short-circuit when switched off.

In this mode of implementation, it is also possible to implement a guard electrical source E and a second source V that use the same excitation frequency or generate a signal of the same shape, which simplifies the detection electronics.

It is also possible to keep the guard source E permanently turned on but to turn on the second source V only periodically, or only when an object 102 is detected in contact with or in proximity to the detection surface 104, based on the measurement of the electrode-object capacitance $C_{eo}$. This makes it possible to measure the electrode-object capacitance $C_{eo}$ under better conditions, more accurately, and limiting the risks of crosstalk, in particular when the objects 102 are distant and therefore this electrode-object capacitance $C_{eo}$ is very low. When the objects 102 are in proximity to or in contact with the detection surface 104, the electrode-object $C_{eo}$ and electrode-guard $C_{eg}$ capacitances are measured simultaneously (or sequentially) as described above.

It should be noted that the guard electrodes 108 fulfil the following functions:

For measuring the electrode-object capacitance $C_{eo}$, the guard electrodes 108 protect the measurement electrodes 106 from parasitic capacitive coupling with the environment by being polarized at the same potential as the measurement electrodes 106, at least from the point of view of the demodulation with respect to the first alternating electrical potential. It should be noted that this holds true even when the second source V is turned on, inasmuch as it supplies an alternating potential difference V1 orthogonal to the first alternating electrical potential, or with different frequencies. To this extent, the first alternating electrical potential is a guard potential;

For measuring the electrode-guard capacitance $C_{eg}$, the guard electrodes 108 are at a potential different from the measurement electrodes 106, with a difference corresponding to the alternating potential difference V1. This allows a capacitance $C_{eg}$ to develop, which can be measured with a demodulation based on the alternating potential difference V1.

Figure 2:
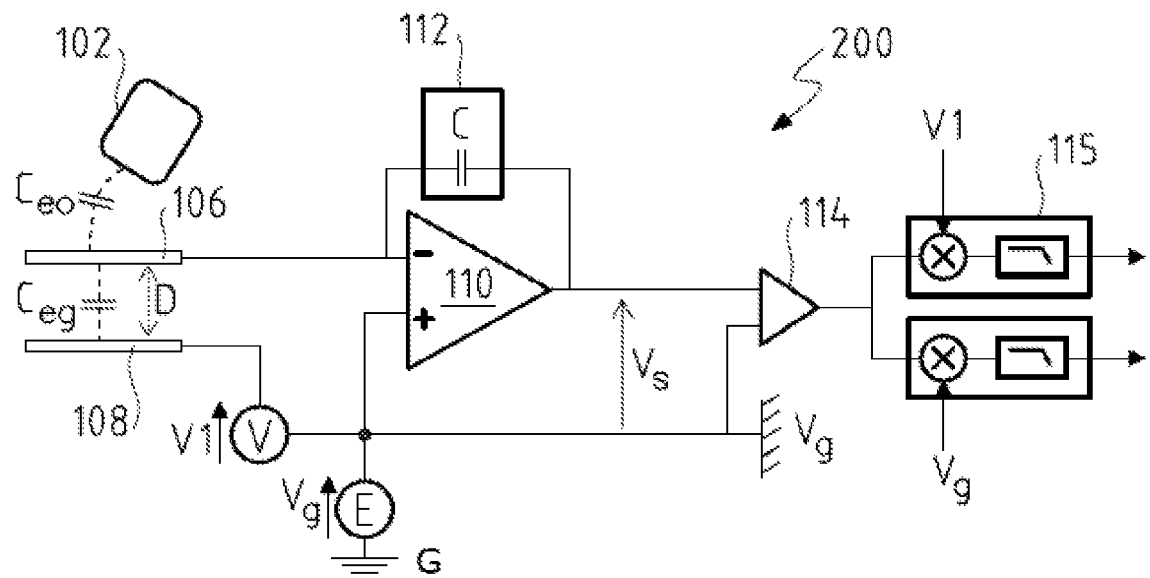
FIG. 2 is a diagrammatic representation of the electrical principle of a second non-limitative embodiment example of a device according to the invention.

FIG. 2 is a simplified diagrammatic representation of the electrical principle of a second embodiment example of a device according to the invention.

The device 200, shown in FIG. 2, comprises all the elements of the device 100 in FIG. 1.

In the device 200, unlike the device 100, the second electrical source V is connected to the guard electrode 108, and not to the measurement electrode 106, via inputs of the OA 110 as shown in FIG. 1. The positive input of the OA 110 is connected to the guard potential $V_g$. The second electrical source V is also referenced to the guard potential $V_g$.

The functioning of the device 200 is essentially similar to that of the device 100.

When the first electrical source E and the second electrical source V are turned on and respectively generate the guard potential (or first alternating electrical potential) $V_g$ and the alternating electrical potential difference V1, a measurement is taken at the output of the operational amplifier (OA) 110 of a signal $V_s$, corresponding to the sum of two signals $V_{sa}$ and $V_{sp}$ representative respectively of the electrode-object capacitance $C_{eo}$, and la electrode-guard capacitance $C_{eg}$:

$$V_s = V_{sa} + V_{sp} \quad (4)$$

with $$V_{sa} = V_g \frac{C_{eo}}{C} \quad (5)$$

and $$V_{sp} = -V1 \frac{C_{eg}}{C} \quad (6)$$

It should be noted that in this embodiment of the device 200, the signal $V_{sp}$ representative of the electrode-guard capacitance $C_{eg}$ does not depend on the electrode-object capacitance $C_{eo}$, as in the case of the device 100. This is an advantage of this embodiment.

The signal $V_s$ can be demodulated as explained with respect to the device 100, with one or two demodulators 115. In particular, all the demodulation methods explained with respect to the device 100 are applicable to the device 200.

As explained above, the device 200 can therefore be implemented with the first electrical source E and the second electrical source V turned on or activated simultaneously, provided that the first alternating electrical potential $V_g$ and the alternating electrical potential difference V1 generated are orthogonal signals or have different frequencies. It is thus possible to demodulate the signals $V_{sa}$ and $V_{sp}$ in parallel with two demodulators 115 as explained above. In this case the first signal with respect to the value of the electrode-object capacitance $C_{eo}$ and the second signal with respect to the value of the electrode-guard capacitance $C_{eg}$ are obtained.

The device 200 can also be implemented by alternately turning on only the first electrical source E, then the second electrical source V. In this case, the first alternating electrical potential $V_g$ and the alternating electrical potential difference V1 generated can be, as above, orthogonal signals or have different frequencies, but they can also have the same frequency or the same shape. Two signals representative respectively of the electrode-object capacitance $C_{eo}$ and the electrode-guard capacitance $C_{eg}$ are then measured alternately or sequentially.

As described with respect to the device 100, it is also possible to keep the first electrical source E permanently turned on but to turn on the second electrical source V only periodically, or only when an object 102 is detected in contact with or in proximity to the detection surface 104, based on the measurement of the electrode-object capacitance $C_{eo}$. This makes it possible to measure the electrode-object capacitance $C_{eo}$ under better conditions, more accurately, and limiting the risks of crosstalk, in particular when the objects 102 are distant and therefore this electrode-object capacitance $C_{eo}$ is very low. When the objects 102 are in proximity or in contact with the detection surface 104, the electrode-object $C_{eo}$ and electrode-guard $C_{eg}$ capacitances are measured simultaneously (or sequentially) as described above.

Figure 3:
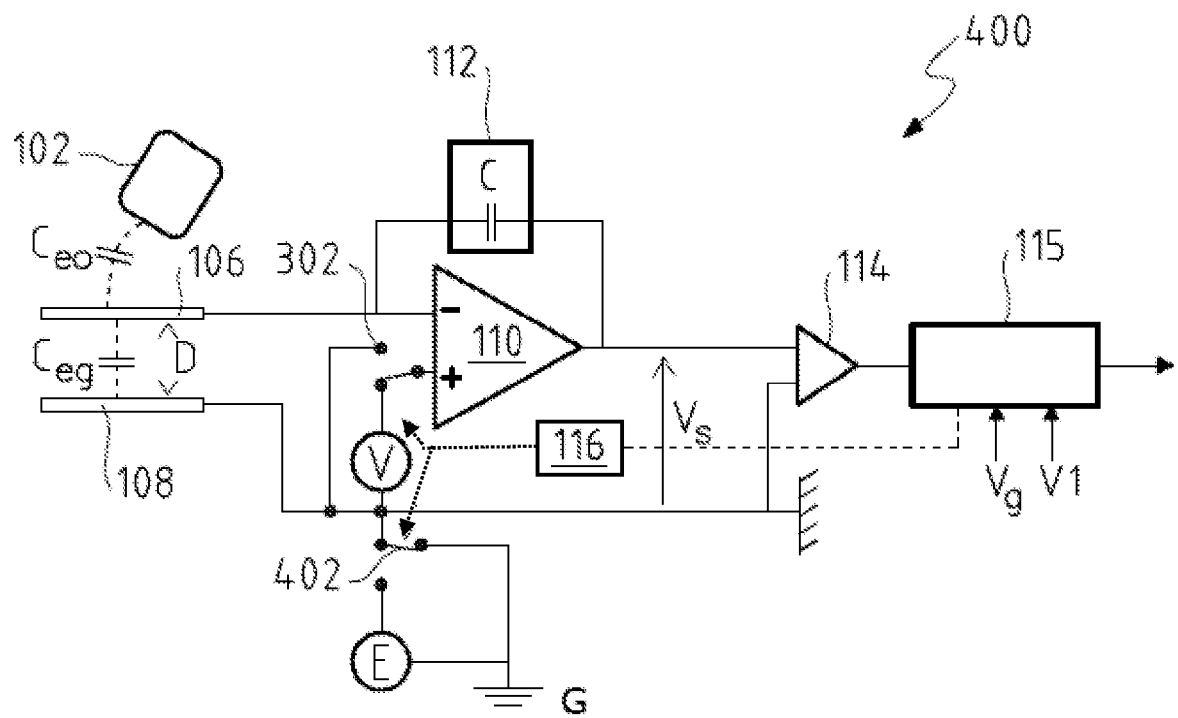
FIG. 3 is a diagrammatic representation of the electrical principle of a third non-limitative embodiment example of a device according to the invention.

FIG. 3 is a simplified diagrammatic representation of the electrical principle of a third embodiment example of a device according to the invention.

The device 400, shown in FIG. 3, comprises all the elements of the device 100 in FIG. 1. It comprises in particular a first electrical source E connected at the input to the ground potential G and at the output in particular to the guard electrode 108. It also comprises a second electrical source V, placed between, on the one hand, the guard electrode 108 and the output of the first electrical source E, and on the other hand, the positive input of the OA 110.

The device 400 also comprises a first switch 402 placed at the output of the first electrical source E. This first switch 402 is controlled by the control module 116 and makes it possible to connect the guard electrode 108:

in a first position, to the output of the first electrical source E; and in a second position, to the ground potential G.

The device 400 also comprises a second switch 302 placed at the output of the second electrical source V. This second switch 302 is also controlled by the control module 116 and makes it possible to connect the positive input of the OA 110:

in a first position, to the guard electrode 108; and in a second position, to the output of the second electrical source V.

It should be noted that the device 400 is functionally equivalent to the device 100 in the case where the first electrical source E or the second electrical source V are turned on or off, respectively.

The first switch 402 is placed so as to connect or disconnect the first electrical source E, or more specifically the output of this first electrical source E, to/from the rest of the circuit, while arranging, when the first electrical source E is disconnected, to connect the guard electrode 108 to the ground potential G (as if the first electrical source E was turned off). It thus makes it possible to avoid turning this first electrical source E on and off at a high rate.

Similarly, the second switch 302 is placed so as to connect or disconnect the second electrical source V, or more specifically the output of this second electrical source V, to/from the rest of the circuit, while arranging, when the second electrical source V is disconnected, to connect the input of the OA 110 to the guard electrode 108 (as if the second electrical source V was turned off). It thus makes it possible to avoid turning this second electrical source V on and off at a high rate.

All the modes of implementation described with respect to the device 100 in FIG. 1 are applicable to the device 400.

However, of course, the device 400 is particularly well adapted to performing sequential measurements, with the first electrical source E and the second source V activated alternately (and thus one at a time). In this case, measurements are taken alternately, at the output of the OA, of a signal $V_s$ that corresponds respectively to the first signal $V_{sa}$ or to the second signal $V_{sp}$, depending on the source that is activated. It is then possible to demodulate this signal $V_s$ as above with two demodulators 115, or to use only a single demodulator 115 as shown in FIG. 3 by switching the carrier signal (for example with the control module 116) so that it corresponds to the one with the activated source.

Thus, for measuring the first signal $V_{sa}$, the first switch 402 is switched in order to connect the guard electrode 108 to the output of the first electrical source E, and the second switch 302 is switched in order to connect the positive input of the OA 110 to the output of the first electrical source E (or to the guard electrode 108). For measuring the second signal $V_{sp}$, the first switch 402 is switched in order to connect the guard electrode 108 to the ground potential G, and the second switch 302 is switched in order to connect the positive input of the OA 110 to the output of the second electrical source V.

According to a variant, the device 400 can comprise a first switch 402 and no second switch 302. In this case, the second source V is still inserted in the circuit. Of course, it can be turned on or off as described above.

According to a variant, the device 400 can comprise a second switch 302 and no first switch 402. In this case, the first source E is still inserted in the circuit. Of course, it can be turned on or off as described above.

Figure 4:
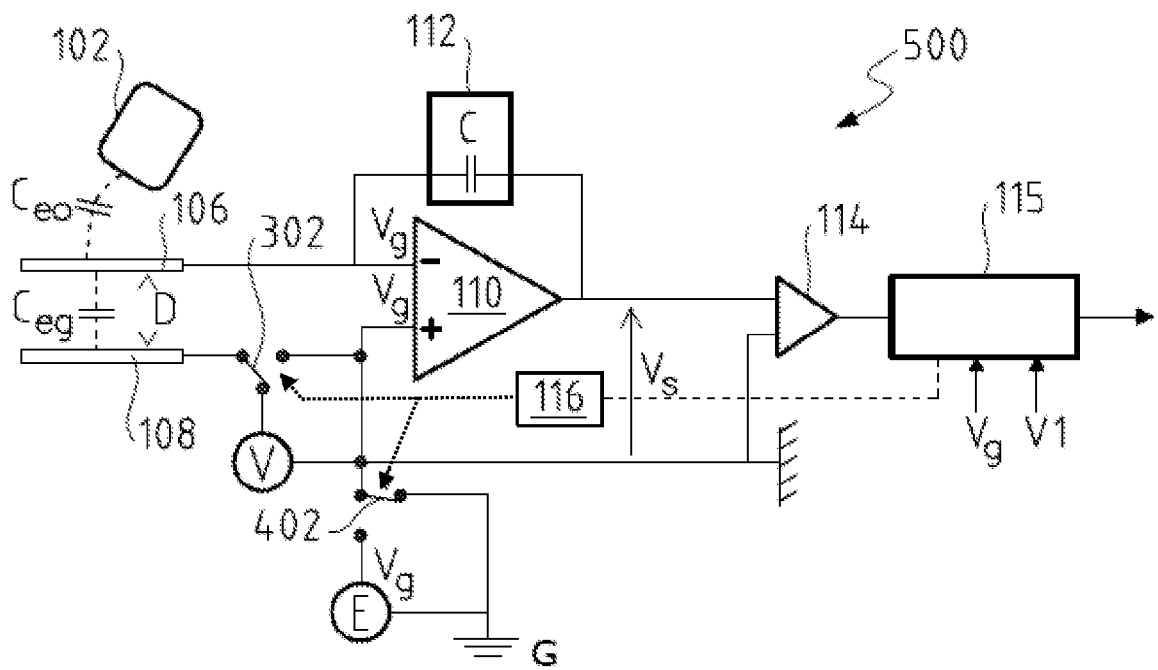
FIG. 4 is a diagrammatic representation of the electrical principle of a fourth non-limitative embodiment example of a device according to the invention.

FIG. 4 is a simplified diagrammatic representation of the electrical principle of a fourth embodiment example of a device according to the invention.

The device 500, shown in FIG. 4, comprises all the elements of the device 200 in FIG. 2. It comprises in particular a first electrical source E connected at the input to the ground potential G and at the output to the positive input of the OA 110. It also comprises a second electrical source V, placed between, on the one hand, the output of the first electrical source E, and on the other hand, the guard electrode 108.

The device 500 also comprises a first switch 402 placed at the output of the first electrical source E. This first switch 402 is controlled by the control module 116 and makes it possible to connect the positive input of the OA 110:
- in a first position, to the output of the first electrical source E; and
- in a second position, to the ground potential G.

The device 500 also comprises a second switch 302 placed at the output of the second electrical source V. This second switch 302 is also controlled by the control module 116 and makes it possible to connect the guard electrode 108:
- in a first position, to the positive input of the OA 110; and
- in a second position, to the output of the second electrical source V.

It should be noted that the device 500 is functionally equivalent to the device 200 in the case where the first electrical source E or the second electrical source V are turned on or off, respectively.

The first switch 402 is placed so as to connect or disconnect the first electrical source E, or more specifically the output of this first electrical source E, to/from the rest of the circuit, while arranging, when the first electrical source E is disconnected, to connect the positive input of the OA 110 to the ground potential G (as if the first electrical source E was turned off). It thus makes it possible to avoid turning this first electrical source E on and off at a high rate.

Similarly, the second switch 302 is placed so as to connect or disconnect the second electrical source V, or more specifically the output of this second electrical source V, to/from the rest of the circuit, while arranging, when the second electrical source V is disconnected, to connect the guard electrode 108 to the positive input of the OA 110 (as if the second electrical source V was turned off). It thus makes it possible to avoid turning this second electrical source V on and off at a high rate.

All the modes of implementation described with respect to the device 200 in FIG. 2 are applicable to the device 500.

However, of course, the device 500 is particularly well adapted to performing sequential measurements, with the first electrical source E and the second source V activated alternately (and thus one at a time). In this case, measurements are taken alternately, at the output of the OA, of a signal $V_s$ that corresponds respectively to the first signal $V_{sa}$ or to the second signal $V_{sp}$, depending on the source that is activated. It is then possible to demodulate this signal $V_s$ as above with two demodulators 115, or to use only a single demodulator 115 as shown in FIG. 4 by switching the carrier signal (for example with the control module 116) so that it corresponds to the one with the activated source.

Thus, for measuring the first signal $V_{sa}$, the first switch 402 is switched in order to connect the positive input of the OA 110 to the output of the first electrical source E, and the second switch 302 is switched in order to connect the guard electrode 108 to the output of the first electrical source E (or to the positive input of the OA 110). For measuring the second signal $V_{sp}$, the first switch 402 is switched in order to connect the positive input of the OA 110 to the ground potential G, and the second switch 302 is switched in order to connect the guard electrode 108 to the output of the second electrical source V.

According to a variant, the device 500 can comprise a first switch 402 and no second switch 302. In this case, the second source V is still inserted in the circuit. Of course, it can be turned on or off as described above.

According to a variant, the device 500 can comprise a second switch 302 and no first switch 402. In this case, the first source E is still inserted in the circuit. Of course, it can be turned on or off as described above.

Figure 5:
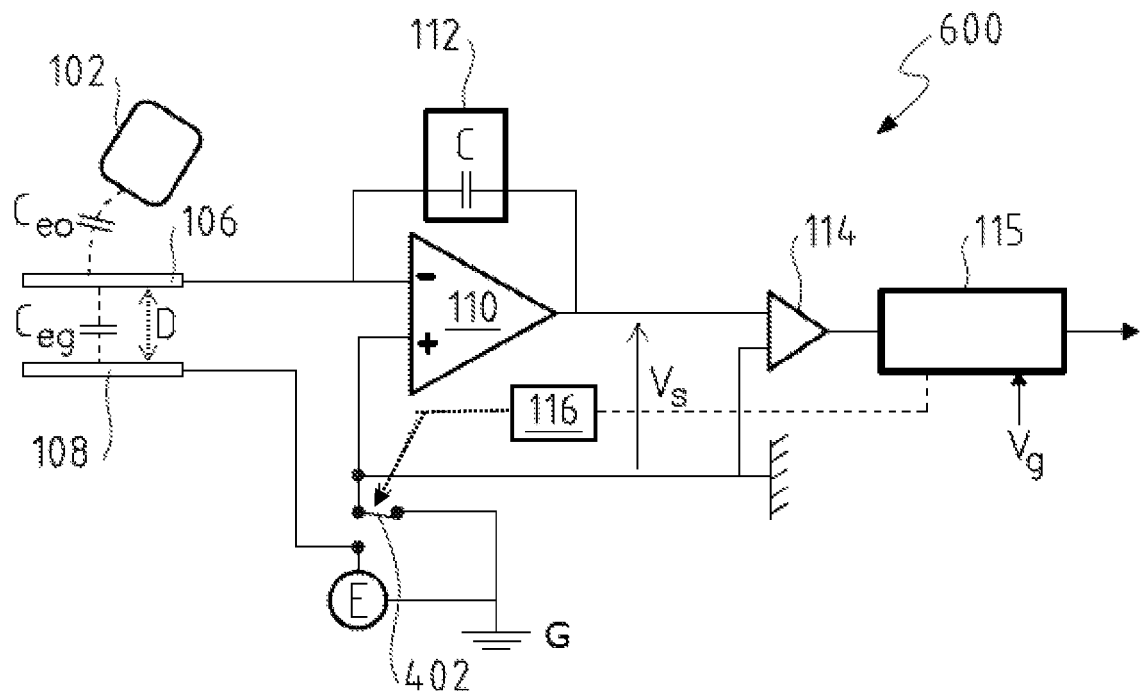
FIG. 5 is a diagrammatic representation of the electrical principle of a fifth non-limitative embodiment example of a device according to the invention.

FIG. 5 is a simplified diagrammatic representation of the electrical principle of a fifth embodiment example of a device according to the invention. The device 600, shown in FIG. 5, comprises all the elements of the device 500 in FIG. 4 for example. It differs however in that:
- it does not comprise a second electrical source V, nor a second switch 302;
- the guard electrode 108 is connected at all times to the output of the first electrical source E and receives the potential $V_g$ supplied by this first electrical source E.

The device 600 comprises a first switch 402 placed at the output of the first electrical source E, and downstream of the guard electrode 108. This first switch 402 is controlled by the control module 116, and makes it possible to connect the positive input of the OA 110:
- in a first position, to the output of the first electrical source E, and to the guard electrode 108; and
- in a second position, to the ground potential G.

This embodiment is very simple inasmuch as it comprises only one source, the first electrical source E. On the other hand, it only allows sequential measurements of the first signal with respect to the value of $C_{eo}$ and of the second signal with respect to the value of $C_{eg}$.

For measuring the first signal with respect to the value of $C_{eo}$, the control module 116 controls the first switch 402 in order to connect the positive input of the OA 110 to the first electrical source E: in this position the guard electrode 108 and the measurement electrode 106 receive the first potential $V_g$.

For measuring the second signal with respect to the value of $C_{eg}$, the control module 116 controls the first switch 402 in order to connect the positive input of the OA 110 to the ground potential G: the guard electrode 108 is then at the first potential $V_g$ and the measurement electrode 106 at the ground potential G. In other words, in this configuration, an alternating electrical potential difference V1 corresponding to the first potential $V_g$ is applied between the measurement electrode 106 and the guard electrode 108.

In this embodiment, the measurement of the first signal provides the following signal at the output of the OA:

$$V_{sa} = V_g \frac{C_{eo}}{C} \quad (7)$$

And the measurement of the second signal provides the following signal at the output of the OA:

$$V_{sp} = -V_g \frac{C_{eg}}{C} \qquad (8)$$

It is then possible to demodulate the first signal $V_{sa}$ and the second signal $V_{sp}$ with a demodulator 115, while using the same carrier signal (for a synchronous demodulator).

According to a variant of the device 600 (not shown) the switch 402 can be placed between the guard electrode 108 on the one hand, and the source E and the ground potential on the other hand, by connecting the positive input of the OA 110 to the source E at all times.

In this case, the first switch 402 makes it possible to connect the guard electrode 108:
- in a first position, to the output of the first electrical source E, and to the positive input of the OA 110; and
- in a second position, to the ground potential G.

In this configuration, the measurement electrode 106 is always polarized at the first potential $V_g$ via the positive input of the OA 110.

Each of the devices described can also comprise at least one calculation module (not shown in the figures) configured in order to:
- determine a distance, a contact or semi-contact between the object 102 and the detection surface 104 as a function of the first measured signal; and/or
- determine a load applied by said object 102 on the detection surface 104 as a function of the second measured signal.

Figure 6:
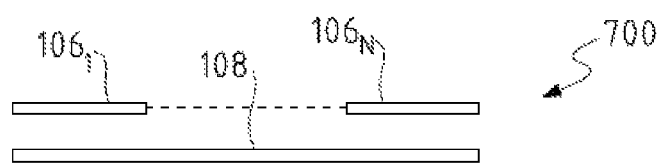
FIGS. 6-8 are diagrammatic representations of different configurations of electrodes that can be implemented in a device according to the invention.

FIG. 6 is a diagrammatic representation of a first configuration of electrodes which can be implemented in a device according to the invention.

In the configuration 700, represented in FIG. 6, the device can comprise a plurality of measurement electrodes $106_1$-$106_N$, and a single guard electrode 108 common to all of the measurement electrodes $106_1$-$106_N$. In the configuration shown, this guard electrode 108 is placed opposite the face of the measurement electrodes $106_1$-$106_N$ opposed to the detection surface 104.

Figure 7:
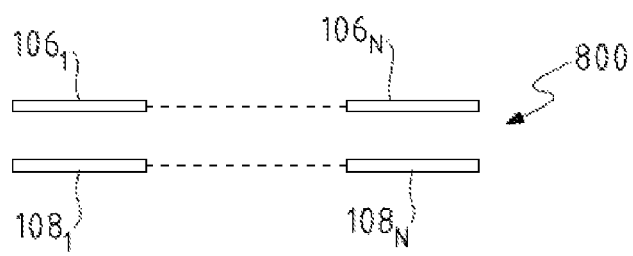

FIG. 7 is a diagrammatic representation of a second configuration of electrodes which can be implemented in a device according to the invention.

In the configuration 800, shown in FIG. 7, the device can comprise a plurality of measurement electrodes $106_1$-$106_N$ and an individual guard electrode, respectively $108_1$-$108_N$, for each measurement electrode $106_1$-$106_N$. In the configuration shown, these guard electrodes $108_1$-$108_N$ are placed opposite the face of the measurement electrodes $106_1$-$106_N$ opposed to the detection surface 104.

Figure 8:
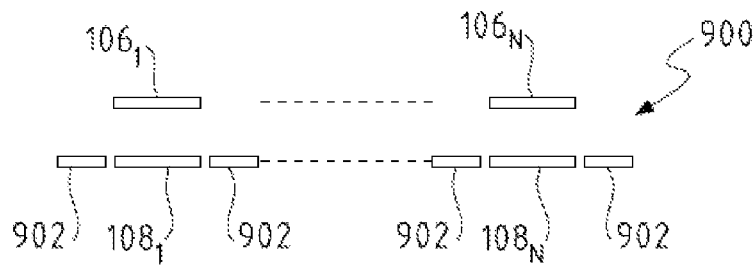

FIG. 8 is a diagrammatic representation of a third configuration of electrodes which can be implemented in a device according to the invention.

In the configuration 900, represented in FIG. 8, the device comprises a plurality of measurement electrodes $106_1$-$106_N$ and an individual guard electrode, respectively $108_1$-$108_N$, for each measurement electrode $106_1$-$106_N$.

It also comprises second guard electrodes 902 preferably placed in one and the same plane as the guard electrodes $108_1$-$108_N$. These second guard electrodes can be produced in the form of a single guard plane 902, or in the form of separate electrodes connected to one and the same potential.

These second guard electrodes 902 are kept at the potential of the measurement electrodes 106, or at least at a potential identical or substantially identical to the potential of the measurement electrodes 106. They thus make it possible to form a guard for these measurement electrodes 106, including during the measurements of the second signal with respect to the value of $C_{eg}$, while avoiding the development of parasitic capacitances between these electrodes 106 and their environment. To this end, in the embodiments described with respect to FIG. 1 to FIG. 5, the second guard electrodes 902 are electrically connected to the positive input of the OA 110. Thus, they "follow" the potential imposed on the inputs of the OA 110 and on the measurement electrodes 106 in all the measurement configurations.

Figure 9:
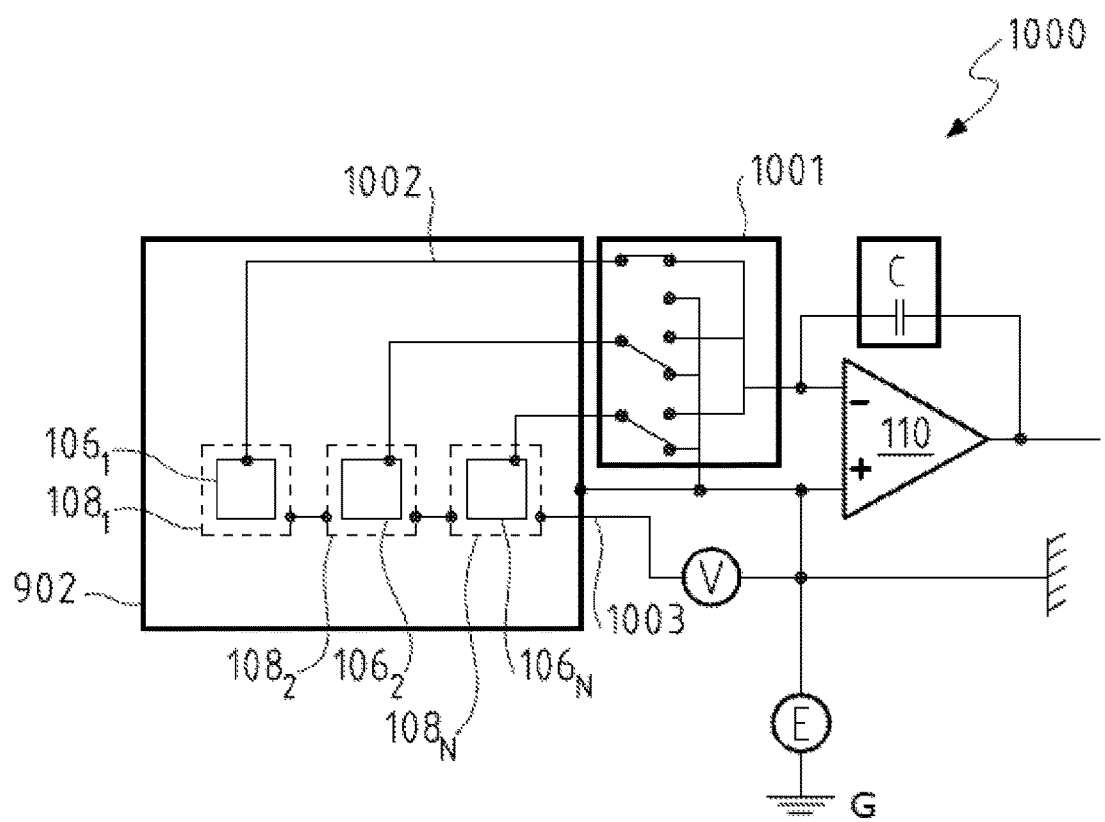
FIG. 9 is a diagrammatic representation of a non-limitative embodiment example of a device according to the invention with a plurality of measurement electrodes.

FIG. 9 is a diagrammatic representation of a non-limitative embodiment example of a device according to the invention with a plurality of measurement electrodes.

It shows an example configuration 1000 making it possible to take measurements sequentially with a plurality of measurement electrodes 106. This configuration 1000 is described based on the configuration 200 in FIG. 2, with the understanding that it can be implemented with all the embodiments described above.

The device comprises a plurality of measurement electrodes $106_1$-$106_N$ connected respectively to an electronic electrode switch (switch) 1001 by connecting tracks 1002.

The electrode switch 1001 is connected at the output to the measurement input (negative input) of the OA 110. It makes it possible to select a measurement electrode $106_1$-$106_N$ with which the measurements of the first and second signal are carried out as described above. This electrode switch 1001 is also arranged so that each measurement electrode $106_1$-$106_N$ is connected, either to the measurement input of the OA 110 in order to constitute an active (measuring) electrode, or to a potential that is identical or substantially identical to that applied to the active electrode or electrodes. Preferably, a single active electrode is selected at a time.

In all the embodiments presented, the measurement electrodes $106_1$-$106_N$ which are not active are connected by the electrode switch 1001 to the positive input of the OA 110, which as explained above is at the same potential as the active measurement electrode 106.

The fact of polarizing the measurement electrodes $106_1$-$106_N$ which are not active at a potential identical or substantially identical to that applied to the active electrode or electrodes makes it possible to avoid any crosstalk between the selected measuring electrode or electrodes and the non-measuring electrodes. The non-measuring electrodes which are thus at the guard potential participate in the optimization of the reach of the measuring electrode or electrodes for proximity detection by creating a maximum guarded surface.

The device also comprises a plurality of guard electrodes $108_1$-$108_N$ placed respectively opposite the measurement electrodes $106_1$-$106_N$. These guard electrodes $108_1$-$108_N$ are interconnected by a connecting track 1003 which makes it possible to connect them to the electronics. According to the embodiment in question, and as described above, the guard electrodes $108_1$-$108_N$ are thus all connected to the second electrical source V as shown, or:
- to the output of the first electrical source E (configuration 100, 600);
- to the switch 302 (configurations 500);
- to the switch 402 (configuration 400).

The surface, the overlap coverage and the form of these electrodes $108_1$-$108_N$ can comprise a wide variety of configurations, as a function of the applications: larger, identical or smaller than the measurement electrodes $106_1$-$106_N$, arranged so as to overlap partially one or more measurement electrodes, in the form of solid or openwork surfaces or tracks or having any forms whatsoever.

Alternatively, as explained above, the guard electrodes $108_1$-$108_N$ can be produced in the form of a guard plane, or a single guard electrode 108.

Optionally, the device also comprises a second guard electrode 902 in the form of a guard plane 902 placed between the guard electrodes $108_1$-$108_N$. This second guard electrode is connected, as described above, to the positive input of the OA 110, in order to be kept at the same potential as the active measurement electrode or electrodes $106_1$-$106_N$.

This second guard electrode 902 for example offers a significant advantage with respect to the connection between the detection surface 104 and the electronics, by eliminating the capacitive leaks from this connection (said connection can be a cable, an extension of the active surface, a flexible connection, a printed circuit element, etc.).

Figure 10:
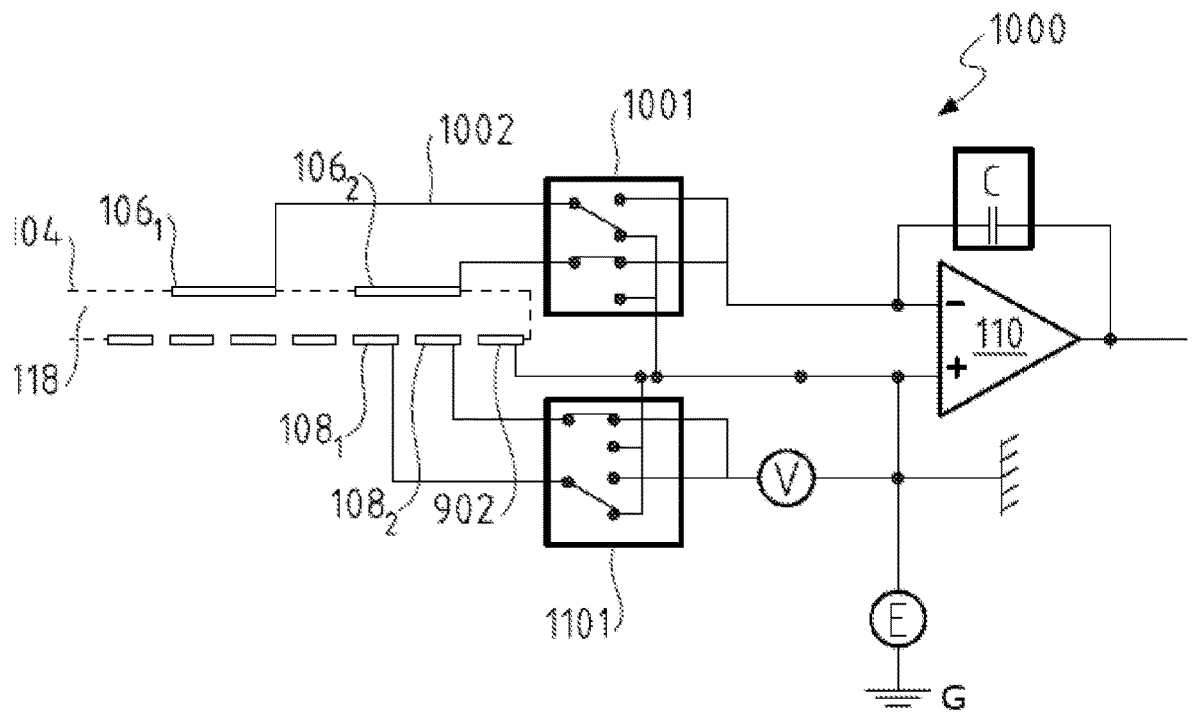
FIG. 10 is a diagrammatic representation of a non-limitative embodiment example of a device according to the invention with a plurality of individually controlled guard electrodes.

FIG. 10 is a diagrammatic representation of a non-limitative embodiment example of a device according to the invention with a plurality of measurement electrodes and a plurality of guard electrodes.

It shows an example embodiment 1100 which makes it possible to control the guard electrodes selectively.

This embodiment 1100 is similar to the embodiment 1000, therefore only the differences will be detailed here.

The configuration 1100 implements a second electrical source V intended to be connected to the guard electrode 108, as for example in the embodiment 200.

The device comprises a plurality of measurement electrodes $106_1$-$106_N$ connected respectively to an electronic electrode switch (switch) 1001 by connecting tracks 1002. The electronic electrode switch (switch) 1001 functions as explained in the embodiment 1000.

The device also comprises a plurality of guard electrodes $108_1$-$108_N$ placed respectively opposite the measurement electrodes $106_1$-$106_N$. These guard electrodes $108_1$-$108_N$ are individually connected by connecting tracks to a guard electrode switch 1101 the operation of which is explained hereinafter. The measurement electrodes $106_1$-$106_N$ and the guard electrodes $108_1$-$108_N$ are represented diagrammatically in a cross section view. They are placed on either side of a layer 118, formed by an elastically compressible dielectric material.

Optionally, the device also comprises second guard electrodes 902 placed between the guard electrodes $108_1$-$108_N$. These second guard electrodes are connected, as described above, to the positive input of the OA 110, in order to be kept at the same potential as the measurement electrode or electrodes $106_1$-$106_N$.

According to the embodiment shown, the guard electrodes $108_1$-$108_N$ have a dimension (for example width and/or length) less than the dimension of the measurement electrodes $106_1$-$106_N$ opposite, so that a measurement electrode is facing several guard electrodes.

The guard electrode switch 1101 is connected to the output of the second electrical source V. It makes it possible to apply selectively the potential difference V1 generated by the second electrical source V to a particular guard electrode $108_1$-$108_N$. This electrode switch 1001 is also arranged so that each guard electrode $108_1$-$108_N$ is connected, either to the second electrical source V in order to constitute an excited guard electrode, or to a potential that is identical or substantially identical to that applied to the measurement electrode or electrodes. Preferably, a single excited guard electrode is selected at a time.

According to an example mode of implementation, during the measurement of the second signal in order to obtain the electrode-guard capacitance $C_{eg}$ (and therefore the load):

A measurement electrode $106_1$ is selected, with the electrode switch 1001 (the active measurement electrode);

A guard electrode $108_1$, present opposite the active measurement electrode, is selected with the electrode switch 1001 (the excited guard electrode);

A measurement of the second signal is carried out in order to obtain the electrode-guard capacitance $C_{eg}$ between the active measurement electrode and the excited guard electrode.

If the measurement electrodes $106_1$-$106_N$ are deformable, it is thus possible to obtain a measurement of load with a spatial resolution that corresponds to the spatial dimension of the guard electrodes $108_1$-$108_N$, and that is therefore better than the spatial resolution achievable with the measurement electrodes $106_1$-$106_N$.

This embodiment therefore has the advantage of allowing a better spatial resolution for measurement of the electrode-guard capacitance $C_{eg}$ than for measurement of the electrode-object capacitance $C_{oe}$. It is thus possible to retain measurement electrodes $106_1$-$106_N$ with a more extensive surface area, allowing a better sensitivity for the distance measurements with a reasonable spatial resolution, and a finer spatial resolution for the load measurements, for which the spatial resolution is important.

In this configuration, it is possible to have several guard electrodes $108_1$-$108_N$ connected together, each being opposite a different measurement electrode $106_1$-$106_N$. Inasmuch as the measurement electrodes $106_1$-$106_N$ are "polled" sequentially, the same spatial resolution is obtained for the load or pressure measurements, while still limiting the number of tracks or channels necessary for the guard electrode switch 1101.

According to embodiments, the guard electrodes $108_1$-$108_N$, can extend opposite several measurement electrodes $106_1$-$106_N$, at least in one direction. In this case, in the perpendicular direction, they can:

extend according to one single measurement electrode (thus with a dimension substantially equal to that of the measurement electrodes);

extend according to several measurement electrodes (thus with a dimension greater than that of the measurement electrodes);

or, as described above, have a dimension less than that of the measurement electrodes, so as to have several guard electrodes opposite one measurement electrode.

This makes it possible in particular to limit the number of channels necessary for the guard electrode switch 1101 without excessively degrading the spatial resolution of the measurement of load, which is determined by the overlap surface area between the active measurement electrode (as selected by the electronic electrode switch 1001) and the excited guard electrode (as selected by the guard electrode switch 1101).

The guard electrode switch 1101 can also be utilized with all the configurations that implement a second electrical source V intended to be connected to the guard electrode 108, as for example in embodiments 200 and 500. When a switch 302 intended to connect or disconnect the second electrical source V is utilized, the guard electrode switch 1101 is inserted between the guard electrodes $108_1$-$108_N$ and this switch 302.

According to embodiments, the device can comprise guard electrodes $108_1$-$108_N$ that are offset or partially overlap with respect to the measurement electrodes $106_1$-$106_N$, and/or that extend respectively opposite several measurement electrodes $106_1$-$106_N$, so as to allow the measurement of a shear displacement of the dielectric material 118 by measurement of a variation in the overlap surface area between at least one of said measurement electrodes $106_1$-$106_N$ and at least one of said guard electrodes $108_1$-$108_N$. This arrangement makes it possible in particular to measure a tangential shear component of a pressure exerted on the detection surface 104. Of course, the device can also comprise guard electrodes $108_1$-$108_N$ respectively opposite a single measurement electrode $106_1$-$106_N$, which are thus insensitive to this shear component (or vice-versa, measurement electrodes $106_1$-$106_N$ respectively opposite a single guard electrode $108_1$-$108_N$). The tangential and perpendicular (or radial) components of a load exerted on the detection surface 104 can thus be deduced from measurements taken with a plurality of electrodes.

For example, the device can comprise at least one guard electrode 108 opposite two neighbouring measurement electrodes 106. In the presence of pure shear displacement in the direction of overlap, the electrode-guard capacitance $C_{eg}$ between one of the measurement electrodes 106 and this guard electrode 108 increases due to the increase in the opposite surface areas, while the electrode-guard capacitance $C_{eg}$ between the other measurement electrode 106 and this same guard electrode 108 reduces.

Of course, the invention is not limited to the examples which have just been described and numerous adjustments can be made to these examples without exceeding the scope of the invention.

The invention claimed is:

1. A device for detecting an object with respect to a detection surface, the device comprising:
   at least one measurement electrode;
   at least one electrode, called a guard electrode;
   a measurement electronics for measuring a signal with respect to an electrical capacitance of said at least one measurement electrode;
   said at least one measurement electrode and said at least guard electrode being separated by a distance (D) that is elastically modifiable locally, by a load exerted by the object on the detection surface; and
   means for electrical polarization of said at least one measurement electrode and said at least one guard electrode, arranged to:
   apply to the at least one measurement electrode and the at least one guard electrode:
   a first alternating electrical potential (Vg), or
   a plurality of second substantially identical, alternating potentials;
   wherein the first alternating electrical potential and the second alternating potentials are different from a ground potential (G), so as to measure a first signal with respect to a capacitance (Ceo), called electrode-object capacitance, between said at least one measurement electrode and the object; and
   apply, between the at least one measurement electrode and the at least one guard electrode, an alternating electrical potential difference (VI), so as to measure a second signal with respect to a capacitance (Ceg), called electrode-guard capacitance, between said at least one measurement electrode and the at least one guard electrode,
   wherein the means for electrical polarization of the electrodes comprises:
   at least one electrical source and at least one electrical switch; or
   at least two electrical sources.

2. The device according to claim 1, wherein the means for electrical polarization of the electrodes are arranged so as to generate the first alternating electrical potential ($V_g$) and the electrical potential difference (V1) satisfying at least one of the following criteria:
   the first alternating electrical potential ($V_g$) and the electrical potential difference (V1) comprise respectively at least one frequency component at a different frequency; and
   the first alternating electrical potential ($V_g$) and the electrical potential difference (V1) comprise signals that are orthogonal to one another.

3. The device according to claim 1, further comprising measurement electronics with at least one demodulation means utilizing at least one of the following elements:
   a synchronous demodulator;
   an amplitude detector; and
   a digital demodulator.

4. The device according to claim 3, further comprising a first demodulation means exploiting the first alternating electrical potential ($V_g$) to determine the first signal, and a second demodulation means exploiting the alternating electrical potential difference (V1) to determine the second signal.

5. The device according to claim 1, wherein the means for electrical polarization of the electrodes are arranged to generate the alternating electrical potential difference (V1) with an amplitude different from the amplitude of the first alternating electrical potential ($V_g$).

6. The device according to claim 1, wherein the means for electrical polarization of the electrodes comprise at least one of the following switches:
   a first switch arranged to make it possible to apply to the at least one guard electrode and to the at least one measurement electrode, either the ground potential (G) or the first alternating electrical potential ($V_g$); and
   a second switch arranged to make it possible to apply between the at least one guard electrode and the at least one measurement electrode, either the alternating electrical potential difference (V1), or a zero or substantially zero potential difference.

7. The device according to claim 1, further comprising at least one calculation module configured to:
   determine a distance or a contact between the object and the detection surface as a function of the first signal; or
   determine a load or a pressure applied by the object on the detection surface as a function of the second signal.

8. The device according to claim 1, wherein said at least one measurement electrode and said at least one guard electrode are separated by a layer that is elastically compressible, comprising or formed by a dielectric material.

9. The device according to claim 1, wherein said at least one measurement electrode is placed on, or in, or under, a support, produced from a flexible material, such as a fabric, placed above and at a distance from said at least one guard electrode, and deforming at least locally when a load is exerted on said support.

10. The device according to claim 1, further comprising several measurement electrodes.

11. The device according to claim 10, further comprising one or more guard electrodes arranged according to at least one of the following configurations:
    at least one of the guard electrodes, placed opposite to each of said at least one measurement electrode;
    for each said at least one measurement electrode, said at least one guard electrode placed opposite said at least one measurement electrode; and for each said at least one measurement electrode, a plurality of guard electrodes placed opposite said at least one measurement electrode.

12. The device according to claim 1, further comprising at least one second guard electrode polarized at a potential identical to the potential of said at least one measurement electrode.

13. The device according to claim 1, further comprising a plurality of measurement electrodes, and an electrode switch making it possible to selectively connect at least one of said measurement electrodes, called "active electrode", to the measurement electronics, said electrode switch also being arranged to polarize the other measurement electrodes of said plurality of measurement electrodes, at the same electrical potential as the active electrode.

14. The device according to claim 1, wherein the measurement electronics comprise a circuit utilizing an operational amplifier with an impedance comprising a feedback capacitive component, said at least one measurement electrode being connected to the negative input of said operational amplifier.

15. The device according to claim 14, wherein the circuit utilizing an operational amplifier is supplied by an electrical supply referenced to the first alternating electrical potential ($V_g$).

16. A detection layer, for an item of equipment, equipped with a device according to claim 1.

17. An item of equipment, equipped with a detection device according to claim 1.

18. A method for the detection of an object with respect to a detection surface utilizing a detection device the method comprising at least one iteration of the following steps:
  a first step of detecting at least one of an approach and a contact of the object with respect to the detection surface comprising the following operations:
    applying to at least one measurement electrode and at least one guard electrode:
      a first alternating electrical potential ($V_g$), or
      second alternating potentials that are substantially identical;
    wherein the first alternating electrical potential and the second alternating potentials are different from a ground potential (G);
    measuring a first signal with respect to a capacitance ($C_{eo}$), called electrode-object capacitance, between said at least one measurement electrode and the object;
  a second step of detecting pressure of the object on the detection surface comprising the following operations:
    applying, between said at least one measurement and said at least one guard electrode, an alternating electrical potential difference (V1); and
    measuring a second signal with respect to a capacitance ($C_{eg}$), called electrode-guard capacitance, between said at least one measurement and said at least one guard electrode.

19. The method according to claim 18, wherein the detection device comprises a plurality of measurement electrodes, the second detection step being carried out only in an area of the detection surface in which the object was detected during the first detection step.

20. The method according to claim 18, further comprising a calibration step comprising:
  detecting at least one of the approach and the contact; and
  detecting pressure, in the absence of a detected object, to determine the electrode-guard capacitance called "calibration capacitance".

21. The method according to claim 20, further comprising a step of functional verification comprising a comparison of an electrode-guard calibration capacitance with a nominal electrode-guard capacitance or a range of nominal electrode-guard capacitances.

* * * * *